United States Patent
Kou et al.

(10) Patent No.: US 12,002,677 B2
(45) Date of Patent: Jun. 4, 2024

(54) PROCESSING DEVICE AND PROCESSING METHOD FOR SOLID STRUCTURE

(71) Applicants: HIGHLIGHT TECH CORP., Tainan (TW); Finesse Technology Co., Ltd., Hsinchu County (TW)

(72) Inventors: Chwung-Shan Kou, Tainan (TW); Wen-Yung Yeh, Tainan (TW)

(73) Assignees: HIGHLIGHT TECH CORP., Tainan (TW); Finesse Technology Co., Ltd., Hsinchu County (TW)

( * ) Notice: Subject to any disclaimer, the term of this patent is extended or adjusted under 35 U.S.C. 154(b) by 106 days.

(21) Appl. No.: 17/742,440

(22) Filed: May 12, 2022

(65) Prior Publication Data

US 2022/0367189 A1    Nov. 17, 2022

Related U.S. Application Data

(60) Provisional application No. 63/302,974, filed on Jan. 25, 2022, provisional application No. 63/188,478, filed on May 14, 2021.

(30) Foreign Application Priority Data

May 5, 2022    (TW) .................................. 111117035

(51) Int. Cl.
*H01L 21/268*    (2006.01)
*H01L 21/67*    (2006.01)

(52) U.S. Cl.
CPC ...... *H01L 21/268* (2013.01); *H01L 21/67115* (2013.01)

(58) Field of Classification Search
CPC ............. H01L 21/268; H01L 21/67115; B23K 2101/40; B23K 2103/56; B23K 26/0006; B23K 26/122; B23K 26/127; B23K 26/346; B23K 26/359; B23K 26/53; B23K 26/0622
USPC ......................................................... 438/775
See application file for complete search history.

(56) References Cited

U.S. PATENT DOCUMENTS

| | | | | |
|---|---|---|---|---|
| 5,406,214 | A * | 4/1995 | Boda .................... | G01N 22/00 324/754.21 |
| 8,828,306 | B2 * | 9/2014 | Uchiyama ............. | B23K 26/40 264/482 |
| 9,406,551 | B2 * | 8/2016 | Werner .............. | H01L 21/02005 |
| 11,264,280 | B2 * | 3/2022 | Aketa .................... | H01L 21/304 |
| 2009/0011614 | A1 * | 1/2009 | Bruland ............... | B23K 26/066 257/E23.15 |

(Continued)

FOREIGN PATENT DOCUMENTS

| CN | 102179635 B | 7/2014 |
|---|---|---|
| CN | 111069793 A | 4/2020 |
| JP | 1149595 | 2/1999 |

(Continued)

*Primary Examiner* — Vu A Vu

(57) ABSTRACT

A processing device and a processing method for a solid structure are used to perform a processing procedure on the solid structure. The processing device for the solid structure of the invention provides energy to the solid structure by various electromagnetic radiation sources to cause the solid structure to generate qualitative changes or defects, that is, to form a modified layer. Stress and/or hardness of the modified layer are/is different from that of other non-processed areas.

21 Claims, 12 Drawing Sheets

(56) References Cited

U.S. PATENT DOCUMENTS

2009/0117707 A1* 5/2009 Shimomura ...... H01L 21/76254
257/E21.568

FOREIGN PATENT DOCUMENTS

| JP | 2005138143 | 6/2005 |
| JP | 2019130538 | 8/2019 |
| JP | 2020077767 | 5/2020 |
| TW | 201141650 A | 12/2011 |
| WO | WO2014203240 | 12/2014 |

* cited by examiner

PROCESSING DEVICE AND PROCESSING METHOD FOR SOLID STRUCTURE

CROSS-REFERENCE TO RELATED APPLICATION

This application claims priority to U.S. Provisional Patent Application No. 63/188,478, filed on May 14, 2021; claims priority from U.S. Provisional Patent Application No. 63/302,974, filed on Jan. 25, 2022; and claims priority from Taiwan Patent Application No. 111117035, filed on May 5, 2022, each of which is hereby incorporated herein by reference in its entireties.

BACKGROUND OF THE INVENTION

1. Field of Invention

The invention relates to a processing device and a processing method, and more particularly to a processing device and a processing method for a solid structure.

2. Description of the Related Art

In recent years, due to the continuous flourishing development of semiconductor technology, technological products have leapt forward. In the semiconductor manufacturing process, processing elements are often used to slice, grind or polish materials such as wafer. Semiconductor materials, such as silicon carbide (SiC), have the advantages of wide bandgap properties, high hardness, high thermal conductivity, and chemical inert properties, so they are ideal materials for manufacturing high-temperature electronic components and high-frequency high-power components. However, due to the high hardness of semiconductor materials, it is not easy to carry out processing procedures such as slicing, grinding or polishing, and will also cause wear to processing elements such as cutter. Therefore, how to improve the processing efficiency and quality of semiconductor materials through modification is one of the current important research and development issues.

SUMMARY OF THE INVENTION

In view of the aforementioned, one object or more than one object of the invention is/are to provide a processing device and a processing method for a solid structure to solve the above-mentioned problems of the prior art.

In order to achieve the above-mentioned object or objects, the invention provides a processing device for a solid structure, at least comprising: a laser source for providing a laser energy to a processing target area of the solid structure in a modification step of a processing procedure; and a microwave or radio-frequency source for providing a microwave or radio-frequency energy to the solid structure in the modification step of the processing procedure, wherein the processing target area of the solid structure generates qualitative changes or defects by the laser energy and the microwave or radio-frequency energy in the modification step of the processing procedure to become a modified layer.

Preferably, the processing device further comprises a heat source for heating the solid structure in the modification step of the processing procedure.

Preferably, the heat source is the laser source, the microwave or radio-frequency source, a heated liquid tank, another laser source, another microwave or radio-frequency source and/or an infrared light source.

Preferably, the solid structure is immersed in a liquid.

Preferably, the processing device further comprises a detection and control unit for detecting a formation state of the modified layer of the solid structure in a detection and control step of the processing procedure, thereby the laser energy provided by the laser source being fed back and controlled and/or the microwave or radio-frequency energy provided by the microwave or radio-frequency source being fed back and controlled.

Preferably, the laser energy provided by the laser source is correspondingly adjusted according to the microwave or radio-frequency energy provided by the microwave or radio-frequency source.

Preferably, the microwave or radio-frequency energy provided by the microwave or radio-frequency source is correspondingly adjusted according to the laser energy provided by the laser source.

Preferably, the laser source provides the laser energy by generating a pulsed light, and the microwave or radio-frequency source provides the microwave or radio-frequency energy by continuously or intermittently generating an electromagnetic wave.

Preferably, the laser source and the microwave or radio-frequency source are capable of respectively providing the laser energy and the microwave or radio-frequency energy in sequence or simultaneously to make the processing target area of the solid structure become the modified layer.

Preferably, the laser source is capable of adjusting a depth at which a focal point of a pulsed light generated by the laser source correspondingly to irradiate the solid structure according to a form of the solid structure.

Preferably, the laser source uses a single pulsed light or a plurality of pulsed lights to form a plurality of focal points to irradiate the processing target area of the solid structure.

Preferably, the laser source irradiates the processing target area of the solid structure with a plurality of pulsed lights of different wavelengths.

Preferably, a direction in which the microwave or radio-frequency source provides the microwave or radio-frequency energy to the solid structure is the same as a direction in which the laser source provides the laser energy to the solid structure.

Preferably, a direction in which the microwave or radio-frequency source provides the microwave or radio-frequency energy to the solid structure is different from a direction in which the laser source provides the laser energy to the solid structure.

In order to achieve the above-mentioned object or objects, the invention provides a processing method for a solid structure for performing a processing procedure, the processing procedure comprises a following step of: performing a modification step, wherein the modification step comprises: using a laser source to provide a laser energy to a processing target area of the solid structure; and using a microwave or radio-frequency source to provide a microwave or radio-frequency energy to the solid structure, wherein the processing target area of the solid structure generates qualitative changes or defects by the laser energy and the microwave or radio-frequency energy to become a modified layer.

Preferably, in or after the modification step, the processing method further comprises performing a heating step to heat the solid structure with a heat source.

Preferably, a hardness or a stress of the modified layer of the solid structure is different from that of other areas of the solid structure.

Preferably, after the modification step is performed, the processing method further comprises performing a subsequent step on the solid structure, the subsequent step is selected from a group consisting of cutting, slicing, thinning, grinding, polishing, coating, vapor deposition, lithography, photolithography, etching and diffusion.

Preferably, the processing target area is located in a depth or on a surface of the solid structure.

Preferably, the processing target area is located in partial areas of the solid structure.

Preferably, the laser energy provided by the laser source for modifying the processing target area is correspondingly adjusted according to the microwave or radio-frequency energy provided by the microwave or radio-frequency source, or the microwave or radio-frequency energy provided by the microwave or radio-frequency source for heating the processing target area is correspondingly adjusted according to the laser energy provided by the laser source.

In summary, based on the above, the processing device and the processing method for the solid structure according to the invention can have one or more than one of following advantages:

(1) The invention utilizes a variety of electromagnetic radiation sources in the modification step to cause qualitative changes or defects in the processing target area of the solid structure, thereby generating stress differences with other areas.

(2) In the modification step of the invention, the pulsed light of the laser source is used to form a hot spot in the processing target area of the solid structure, so as to cause the processing target area of the solid structure to generate a modification phenomenon, such as qualitative changes or defects, for example, weakened atomic bond, weakened structure, or monocrystalline state transformed into polycrystalline state or amorphous state. In the invention, the microwave or radio-frequency source is used to provide the microwave or radio-frequency energy to the solid structure at the same time when the modification step is performed, free electrons are generated in the processing target area of the solid structure due to supply of the laser energy, compared with other areas (non-processing target areas), generation of the free electrons is capable of absorbing more microwave energy to increase a temperature of the processing target area, and increase in temperature is conducive to the processing target area absorbing more of the laser energy to generate more free electrons, thereby absorbing more of the electromagnetic energy provided by the electromagnetic radiation source to form a forward cycle.

(3) In the invention, the heat source is used to heat the solid structure in the modification step, so that a temperature of the solid structure can be increased, and an absorption rate of the energy of the radiation source can be increased by increasing a temperature.

(4) The invention detects a formation state of the modified layer of the solid structure in the detection and control step, thereby the laser energy provided by the laser source can be fed back and controlled and/or the microwave or radio-frequency energy provided by the microwave or radio-frequency source can be fed back and controlled, such as control of magnitude, frequency or processing feeding speed of the microwave or radio-frequency energy provided by the microwave or radio-frequency source.

In order to enable the examiner to have a further understanding and recognition of the technical features of the invention and the technical efficacies that can be achieved, preferred embodiments in conjunction with detailed explanation are provided as follows.

DETAILED DESCRIPTION OF THE INVENTION

Figure 1:
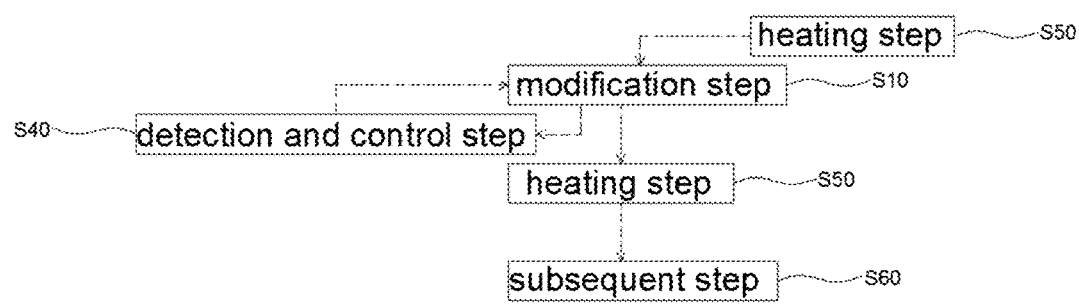
FIG. 1 is a schematic diagram of a processing procedure performed by a processing method for a solid structure of the invention.

In order to understand the technical features, content and advantages of the invention and its achievable efficacies, the invention is described below in detail in conjunction with the figures, and in the form of embodiments, the figures used herein are only for a purpose of schematically supplementing the specification, and may not be true proportions and precise configurations after implementation of the invention; and therefore, relationship between the proportions and configurations of the attached figures should not be interpreted to limit the scope of the claims of the invention in actual implementation. In addition, in order to facilitate understanding, the same elements in the following embodiments are indicated by the same referenced numbers. And the size and proportions of the components shown in the drawings are for the purpose of explaining the components and their structures only and are not intending to be limiting.

Unless otherwise noted, all terms used in the whole descriptions and claims shall have their common meaning in the related field in the descriptions disclosed herein and in other special descriptions. Some terms used to describe in the present invention will be defined below or in other parts of the descriptions as an extra guidance for those skilled in the art to understand the descriptions of the present invention.

The terms such as "first", "second", "third" used in the descriptions are not indicating an order or sequence, and are not intending to limit the scope of the present invention.

They are used only for differentiation of components or operations described by the same terms.

Moreover, the terms "comprising", "including", "having", and "with" used in the descriptions are all open terms and have the meaning of "comprising but not limited to".

The invention provides a processing device and a processing method for a solid structure, the processing device and the processing method are used for performing a processing procedure on the solid structure to be processed (i.e., an object to be processed), and are applicable to various different semiconductor manufacturing processes, such as, but not limited to SOI (silicon-on-insulator) semiconductor manufacturing process, ingot slicing process, wafer thinning process or packaging process. The solid structure is, for example, but not limited to, solid objects containing semiconductor materials in the above-mentioned semiconductor manufacturing process, such as wafer or ingot crystal structure. Wherein, the above-mentioned semiconductor materials are, for example, but not limited to, substrate materials such as Si, SiC, SiGe, Ge, GaAs, GaN, or InP, and the crystal structure is, for example, but not limited to, monocrystalline, polycrystalline or amorphous structure. The processing procedure performed by the processing method of the invention at least comprises: performing a modification step to make a processing target area of the solid structure become a modified layer.

Please refer to FIG. 1, in a modification step S10 of the processing procedure of the invention, the processing device for the solid structure of the invention provides a variety of electromagnetic energies to the processing target area of the solid structure by a variety of electromagnetic radiation sources, wherein the electromagnetic energies are used as modification energies to cause qualitative changes or defects in the processing target area of the solid structure, that is, to become a modified layer. For example, the invention is capable of using two electromagnetic radiation sources to respectively provide two kinds of electromagnetic energies to the processing target area of the solid structure, thereby causing qualitative changes or defects in the processing target area of the solid structure to make the processing target area become a modified layer.

Figure 2:
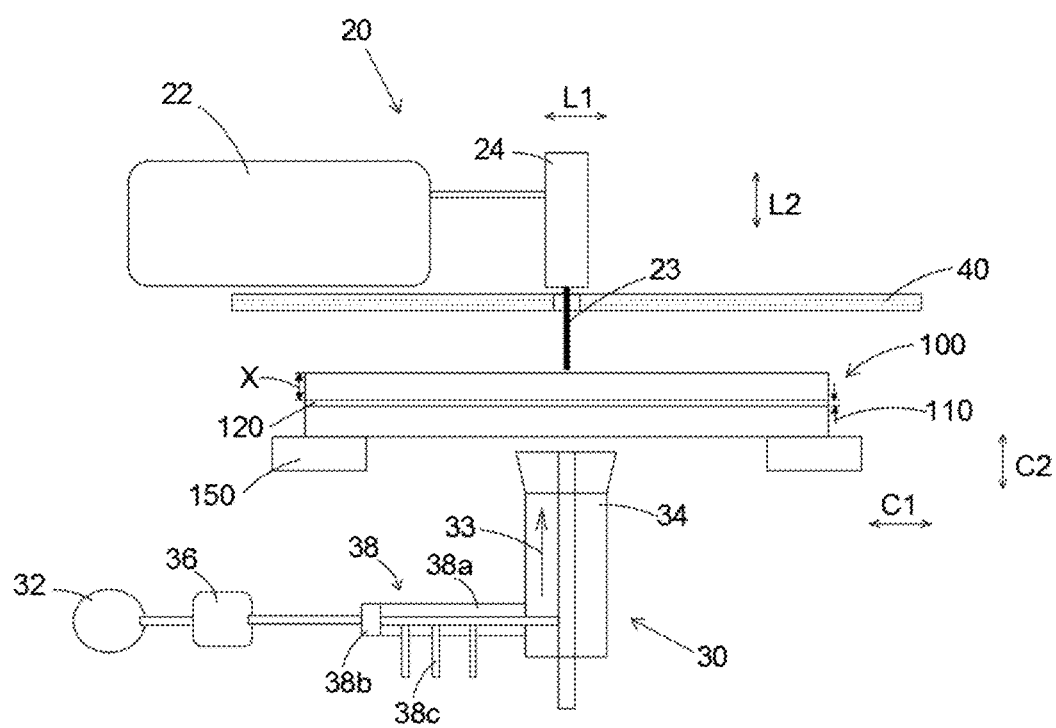
FIG. 2 is a schematic diagram of a modification step performed by a processing device for a solid structure according to a first embodiment of the invention.
Figure 3:
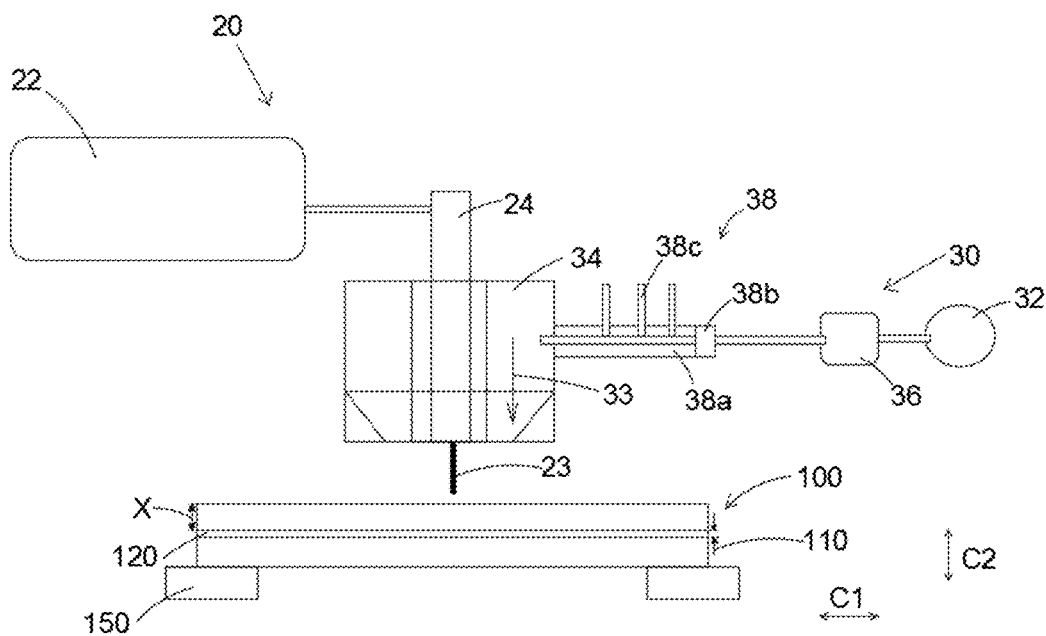
FIG. 3 is a schematic diagram of the modification step performed by the processing device for the solid structure according to a second embodiment of the invention.
Figure 4:
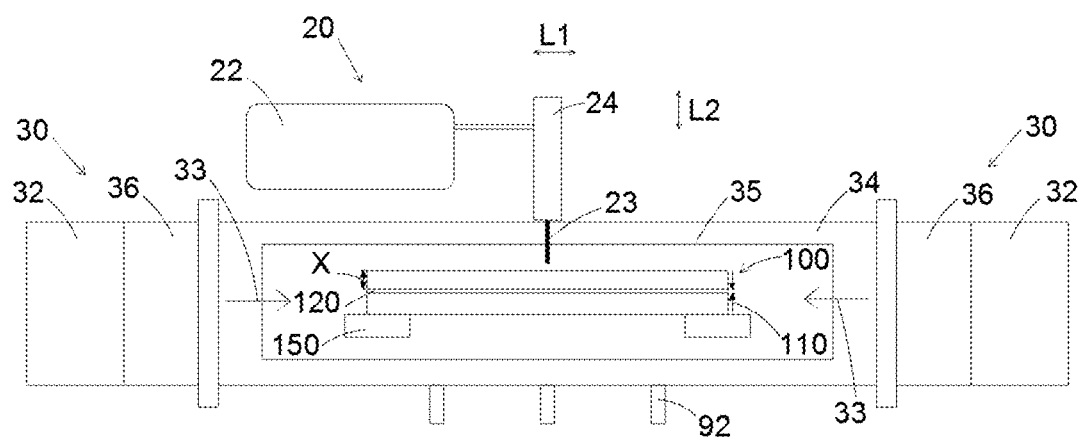
FIG. 4 is a schematic diagram of the modification step performed by the processing device for the solid structure according to a third embodiment of the invention.
Figure 6:
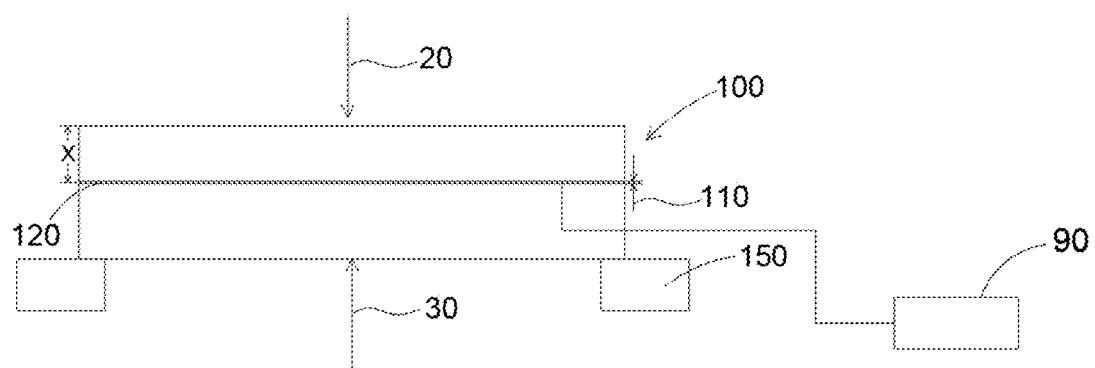
FIG. 6 is a schematic diagram of using a detection and control unit to detect a formation state of a modified layer in the invention.
Figure 7:
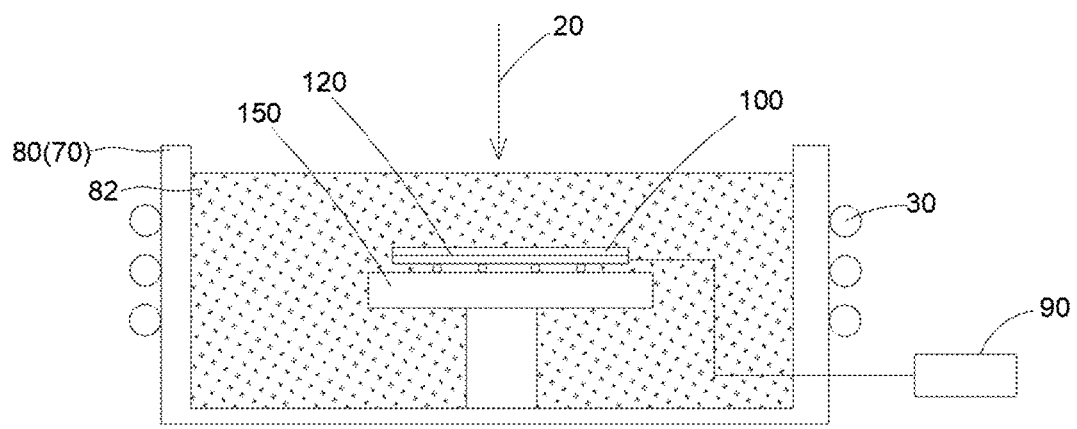
FIG. 7 is a schematic diagram of a heating step performed in a heated liquid tank by the processing device for the solid structure of the invention.

Please refer to FIGS. 2 to 4, a solid structure 100 as a wafer is used as an example, the wafer is defined with a processing target area 110 located in a radial section or an axial section of the wafer, the radial section or the axial section can be, for example, in any depth or on a surface of the wafer. The solid structure 100 is carried, for example, on a carrier 150, the carrier 150 is, for example, but not limited to, a movable carrier. In addition, the processing procedure of the solid structure 100 is not limited to being performed in a chamber such as a heated liquid tank 80 (as shown in FIG. 7) or not being performed in a chamber such as a heated liquid tank (as shown in FIG. 6). A first electromagnetic radiation source of the two electromagnetic radiation sources provides a first electromagnetic energy to the processing target area 110 of the solid structure 100, so as to cause the solid structure 100 at the processing target area 110 to generate a modification phenomenon, such as qualitative changes or defects, for example, weakened atomic bond, weakened structure, or monocrystalline state transformed into polycrystalline state or amorphous state, that is, a modified layer 120 is formed. A thickness of the solid structure 100 is, for example, but not limited to, in a range of about 50 µm to about 1,800 µm. The processing target area 110 is, for example, located in a depth X or on a surface of the solid structure 100. Wherein area, thickness, distribution direction and distribution method of the modified layer 120 formed in the solid structure 100 in the invention are not particularly limited, for example, they can be determined according to actual manufacturing process requirements. If the solid structure 100 is an ingot, its thickness is, for example, but not limited to, greater than 800 µm.

The first electromagnetic radiation source used in the invention is, for example, a laser source 20, which generates a pulsed light with a laser energy in the modification step S10 of the processing procedure for irradiating the processing target area 110 of the solid structure 100. Taking a thickness of the solid structure 100 as 1,800 µm as an example, the depth X of the processing target area 110 can be between about 0 µm and about 1,800 µm. The laser source 20 generates a pulsed light 23 through a laser generator 22, and the pulsed light 23 is transmitted onto the solid structure 100 through a lens set 24. Since the pulsed light 23 of the laser source 20 will form a non-linear absorption effect and generate a thermal effect at a focal point to form a hot spot, the solid structure 100 at the focal point will be ionized to generate free electrons, and energy of the free electrons will also be transferred to the solid structure 100 at the focal point to increase a temperature of the solid structure 100 at the focal point, that is, an absorption coefficient of the focal point will be increased to absorb more of the laser energy provided by the laser source 20, thereby increasing a modification effect. Therefore, when the focal point of the pulsed light 23 generated by the laser source 20 is focused on the processing target area 110 of the solid structure 100, the laser energy will be provided for the processing target area 110 of the solid structure 100 to generate a modification phenomenon, such as qualitative changes or defects, for example, weakened atomic bond, weakened structure, or monocrystalline state transformed into polycrystalline state or amorphous state.

A second electromagnetic radiation source of the two electromagnetic radiation sources provides a second electromagnetic energy to the processing target area 110 of the solid structure 100, wherein the first electromagnetic energy provided by the first electromagnetic radiation source is capable of causing the the processing target area 110 of the solid structure 100 to generate free electrons, generation of the free electrons is conducive to absorbing the second electromagnetic energy provided by the second electromagnetic radiation source to increase a temperature of the processing target area 110, and increase in temperature is conducive to the processing target area 110 absorbing more of the first electromagnetic energy to generate more free electrons, thereby absorbing more of the second electromagnetic energy provided by the second electromagnetic radiation source to form a forward cycle.

In the invention, the second electromagnetic radiation source is, for example, a microwave or radio-frequency source 30, which continuously or intermittently generates an electromagnetic wave in the modification step S10 of the processing procedure to provide a microwave or radio-frequency energy to the solid structure 100. Taking the second electromagnetic radiation source as a microwave source as an example, the microwave or radio-frequency source 30 generates a microwave 33 through a microwave generator 32 (such as a magnetron) and transmits the microwave 33 to the solid structure 100 through a coaxial resonator 34. Wherein, an isolator 36 is preferably provided between the microwave generator 32 and the coaxial resonator 34, which is capable of providing an effect of unidirectional transmission of the microwave 33, and a matcher 38 is further preferably provided on a transmission path of the microwave 33 (such as the coaxial resonator 34), which is capable of reducing an amount of microwave reflection, so that the microwave 33 is capable of effectively entering the coaxial resonator 34 and thereby being transmitted onto the solid structure 100. The matcher 38 is composed of, for example, a coaxial tube 38a, a metal plate 38b and a metal rod 38c, but a structure of the microwave or radio-frequency source 30 described above is only a preferred example and is not intended to limit the invention. Compared with ultraviolet light or infrared light, the microwave 33 provided by the microwave source used in the invention is capable of penetrating the solid structure 100 such as a wafer/an ingot, and the microwave 33 is capable of vibrating bonds between atoms (such as silicon atoms) of the wafer/ingot. Due to an internal frictional heat generated by reciprocating motion of the bonds, substances inside and outside the wafer/ingot heat up at the same time, generating more free electrons. A wavelength of the microwave 33 is in a range of about 1 mm to about 1 m, and a frequency is in a range of about 300 GHz to about 0.3 GHz. Output mode of the microwave 33 can be a continuous microwave source or an intermittent microwave source with a pulse width ranging from about 1 μs to about 1 ms. The laser energy provided by the laser source 20 and the microwave or radio-frequency energy provided by the microwave or radio-frequency source 30 are capable of causing the solid structure 100 to generate a phenomenon of qualitative changes or defects in the processing target area 110 to make the processing target area 110 become the modified layer 120.

In addition, since the processing target area 110 of the solid structure 100 (i.e., where the modified layer 120 is located) has more free electrons at the focal point of the pulsed light 23 of the laser source 20 than other areas (non-processing target areas) of the solid structure 100, compared with other areas (non-processing target areas), generation of the free electrons is capable of absorbing more microwave energy to increase a temperature of the processing target area 110, and increase in temperature is conducive to the processing target area 110 absorbing more of the first electromagnetic energy to generate more free electrons, thereby absorbing more of the second electromagnetic energy provided by the second electromagnetic radiation source to form a forward cycle, thus generating a greater thermal difference between the processing target area 110 and other non-processing target areas. Therefore, there are more differences in properties such as stress and/or hardness correspondingly to be capable of effectively modifying the processing target area 110 of the solid structure 100. Wherein, the above-mentioned temperature can be detected by, for example, a temperature sensor 92 (e.g., an infrared temperature sensor). Wherein, in the modification step S10, since the processing target area 110 of the solid structure 100 is capable of absorbing laser energy and microwave energy to generate thermal effects, a hardness of the processing target area 110 of the solid structure 100 can be lower than that of other non-processing target areas.

Figure 8:
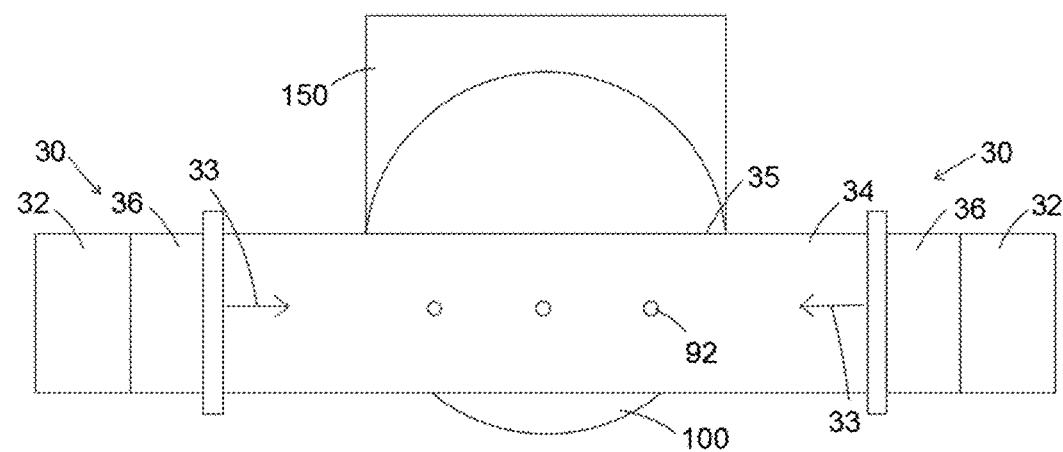
FIG. 8 is a schematic diagram of FIG. 4 viewed from another angle.

In addition, a direction of microwaves or radio-frequency electromagnetic waves with the microwave or radio-frequency energy provided by the microwave or radio-frequency source 30 of the invention is not particularly limited, microwaves or radio-frequency electromagnetic waves can be provided in a direction different from (an opposite side as shown in FIG. 2), the same as (a same side as shown in FIG. 3) or perpendicular to (as shown in FIG. 4 and FIG. 8) a direction in which the laser source 20 provides the laser energy to the solid structure 100. In the invention, the dual microwave or radio-frequency sources 30 can also be used to provide the microwave or radio-frequency energy, as shown in FIG. 4 and FIG. 8, two sets of the microwave or radio-frequency sources 30 share the same coaxial resonator 34 and are respectively disposed on left and right sides of the solid structure 100, and the microwave or radio-frequency energy is provided in a direction perpendicular to a direction in which the laser source 20 provides the laser energy. Wherein the coaxial resonator 34 shown in FIGS. 4 and 8 can be further optionally provided with an opening 35, so that the carrier 150 is capable of using the opening 35 to send areas to be processed on the solid structure 100 into the coaxial resonator 34. The coaxial resonator 34 can be made of, for example, a transparent or an opaque material. Furthermore, in addition to the aforementioned opposite side direction, same side direction, and perpendicular direction, an included angle can be between a direction in which the microwave or radio-frequency source 30 provides the microwave or radio-frequency energy and a direction in which the laser source 20 provides the laser energy, and the included angle ranges from about 0 degree to about 180 degrees. In addition, a direction in which the microwave or radio-frequency source 30 provides the microwave or radio-frequency energy can also be adjusted, for example, a direction in which the microwave or radio-frequency source 30 provides the microwave or radio-frequency energy and a direction in which the laser source 20 provides the laser energy and/or the included angle can be adjusted according to surface topography or composition of the solid structure 100.

In addition, the pulsed light 23 provided by the laser source 20 is capable of scanning along a direction of the radial section or the axial section to provide energy to the solid structure 100, and a direction of formation of qualitative changes or defects of the solid structure 100 is parallel to a direction of the radial section or the axial section, wherein a scanning path of the pulsed light 23 along a direction of the radial section or the axial section is not particularly limited, any scanning paths can be applicable to the invention as long as the laser energy can be provided to the processing target area 110 of the solid structure 100. Since microwaves or radio-frequency electromagnetic waves are capable of penetrating the solid structure 100 such as a wafer/an ingot, a direction in which microwaves or radio-frequency electromagnetic waves provided by the microwave or radio-frequency source 30 can be parallel to a direction of the radial section or the axial section, perpendicular to a direction of the radial section or the axial section, or can be provided in other directions. Optionally, only the processing target area 110 of the solid structure 100 that generates qualitative changes or defects due to energy provided by the laser source 20 will absorb more microwave or radio-frequency energy than non-processing target areas. Wherein, no matter which direction the microwave or radio-frequency source 30 provides microwaves or radio-frequency electromagnetic waves, an absorption element 40 can be disposed on an opposite side to avoid unnecessary scattering and improve an uniformity of absorption (as shown in FIG. 2). Since configuration and operation principles of the laser source 20 and the microwave or radio-frequency source 30 are well known to a person having ordinary skill in the art, no further description will be given in the invention herein.

A power of the microwave or radio-frequency source 30 of the invention is, for example, in a range of about 200 watts to about 5,000 watts, and the laser energy output by the laser source 20 of the invention is not limited to be higher than, lower than or equal to the microwave or radio-frequency energy output by the microwave or radio-frequency source 30. Wherein, the laser energy provided by the laser source 20 of the invention for modifying the processing target area 110 can be, for example, but not limited to, correspondingly adjusted according to the microwave or radio-frequency energy provided by the microwave or radio-frequency source 30, and the microwave or radio-frequency energy provided by the microwave or radio-frequency source 30 of the invention for heating the processing target area 110 of the solid structure 100 can be, for example, but not limited to, correspondingly adjusted according to the laser energy provided by the laser source 20, as long as the processing target area 110 of the solid structure 100 can become the modified layer 120, any amounts of the laser energy and the microwave or radio-frequency energy can be applicable to the invention. According to the aforementioned forward cycle effect, for example, when an amount of the microwave or radio-frequency energy provided by the microwave or radio-frequency source 30 for the processing target area 110 of the solid structure 100 is increased, an amount of the laser energy provided by the laser source 20 for the processing target area 110 of the solid structure 100 can be correspondingly reduced. Alternatively, when an amount of the laser energy provided by the laser source 20 for the processing target area 110 of the solid structure 100 is fixed, an amount of the microwave or radio-frequency energy provided by the microwave or radio-frequency source 30 for the processing target area 110 of the solid structure 100 can be reduced or increased to achieve the aforementioned forward cycle effect.

Figure 5:
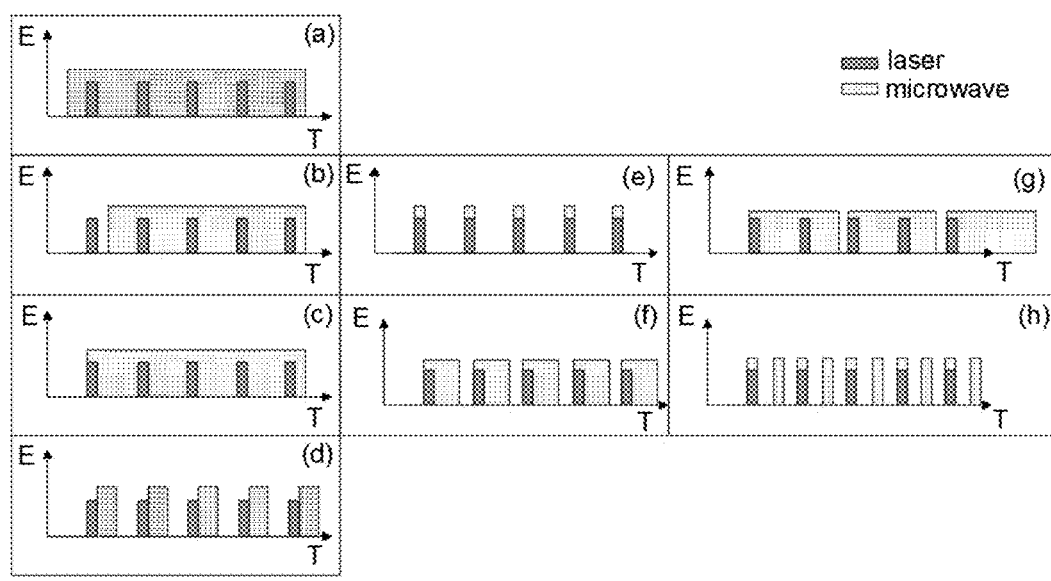
FIG. 5 is a schematic diagram of output frequencies of a laser energy and a microwave (or radio-frequency) energy in the invention.

In addition, the laser source 20 of the invention provides the laser energy by generating the pulsed light 23, and the microwave or radio-frequency source 30 provides the microwave or radio-frequency energy by continuously or intermittently generating an electromagnetic wave. Thereby, the laser source 20 and the microwave or radio-frequency source 30 of the invention are capable of respectively outputting the pulsed light 23 and microwaves or radio-frequency electromagnetic waves in sequence or simultaneously to provide the laser energy and the microwave or radio-frequency energy to make the processing target area 110 of the solid structure 100 become the modified layer 120. FIG. 5 is a schematic diagram of output frequencies of a laser energy and a microwave (or radio-frequency) energy in the invention. As shown in FIG. 5, the laser source 20 provides the laser energy by the pulsed light 23, the microwave or radio-frequency source 30 is capable of continuously generating microwaves or radio-frequency electromagnetic waves to provide the microwave or radio-frequency energy (as shown in (a), (b) and (c) in FIG. 5), alternatively the microwave or radio-frequency source 30 is also capable of intermittently generating microwaves or radio-frequency electromagnetic waves to provide the microwave or radio-frequency energy (as shown in (d), (e), (f), (g) and (h) in FIG. 5). In FIG. 5, abscissa T represents time, and ordinate E represents pulse energy (E), which are used to represent output frequencies, not actual energy levels.

Taking the microwave or radio-frequency source 30 intermittently generating microwaves or radio-frequency electromagnetic waves as an example, in terms of turn-on time point, the microwave or radio-frequency source 30 can be turned on before the laser source 20 outputs the pulsed light 23, and turned off after the pulsed light 23 is turned off. The microwave or radio-frequency source 30 can be turned on after the laser source 20 outputs the pulsed light 23, and turned off after the pulsed light 23 is turned off. Alternatively, the microwave or radio-frequency source 30 can be turned on simultaneously when the laser source 20 outputs the pulsed light 23, and turned off after the pulsed light 23 is turned off. In terms of output frequency, microwaves or radio-frequency electromagnetic waves output by the microwave or radio-frequency source 30 can have, for example, a same frequency and a same providing time as that of the pulsed light 23 output by the laser source 20. Alternatively, microwaves or radio-frequency electromagnetic waves output by the microwave or radio-frequency source 30 can have, for example, a same frequency as that of the pulsed light 23 output by the laser source 20 and a providing time longer than a pulse width of the pulsed light 23 output by the laser source 20, such as n times longer, wherein n can be, for example, a positive integer or decimal. In addition, taking the microwave or radio-frequency source 30 continuously generating microwaves or radio-frequency electromagnetic waves as an example, in terms of output frequency, microwaves or radio-frequency electromagnetic waves output by the microwave or radio-frequency source 30 can also have, for example, a frequency different from that of the pulsed light 23 output by the laser source 20, and an output frequency of microwaves or radio-frequency electromagnetic waves is lower than or higher than an output frequency of the pulsed light 23. Alternatively, microwaves or radio-frequency electromagnetic waves output by the microwave or radio-frequency source 30 can have, for example, a frequency different from that of the pulsed light 23 output by the laser source 20, and an output frequency of microwaves or radio-frequency electromagnetic waves is n times an output frequency of the pulsed light 23 output by the laser source 20, wherein n can be, for example, a positive integer or decimal.

Figure 9A:
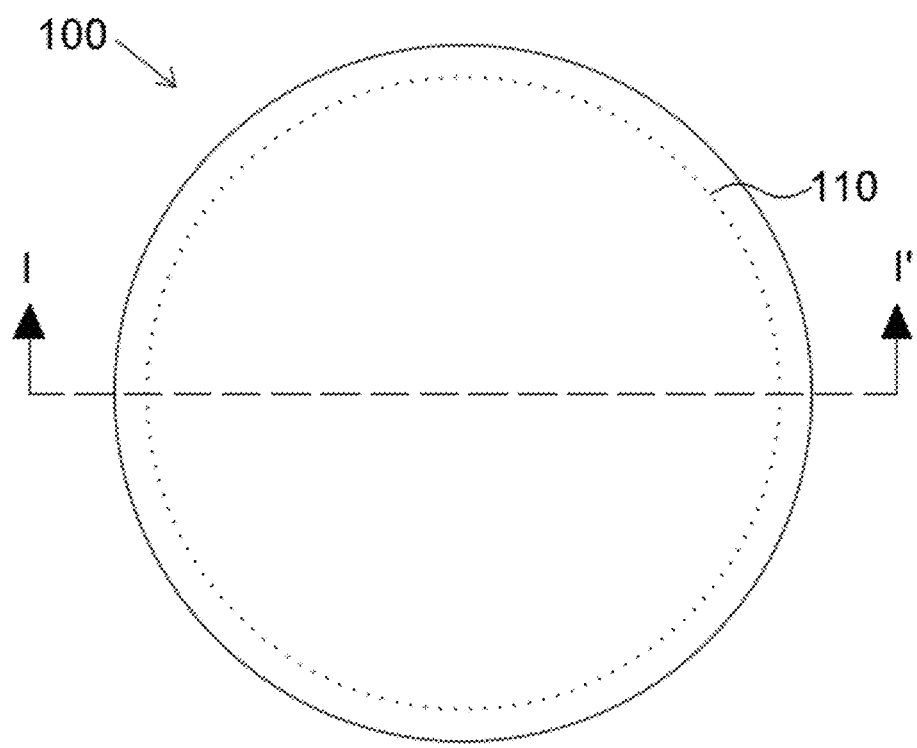
FIGS. 9a and 9b are respectively a top view and a cross-sectional side view of the solid structure of the invention having a single processing target area located in a partial area.
Figure 9B:
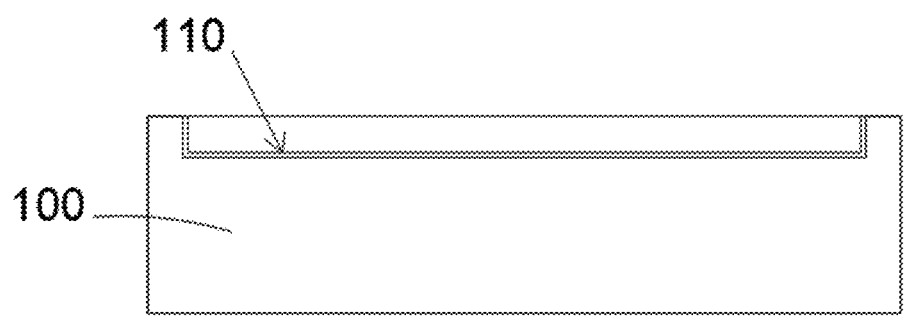
Figure 9C:
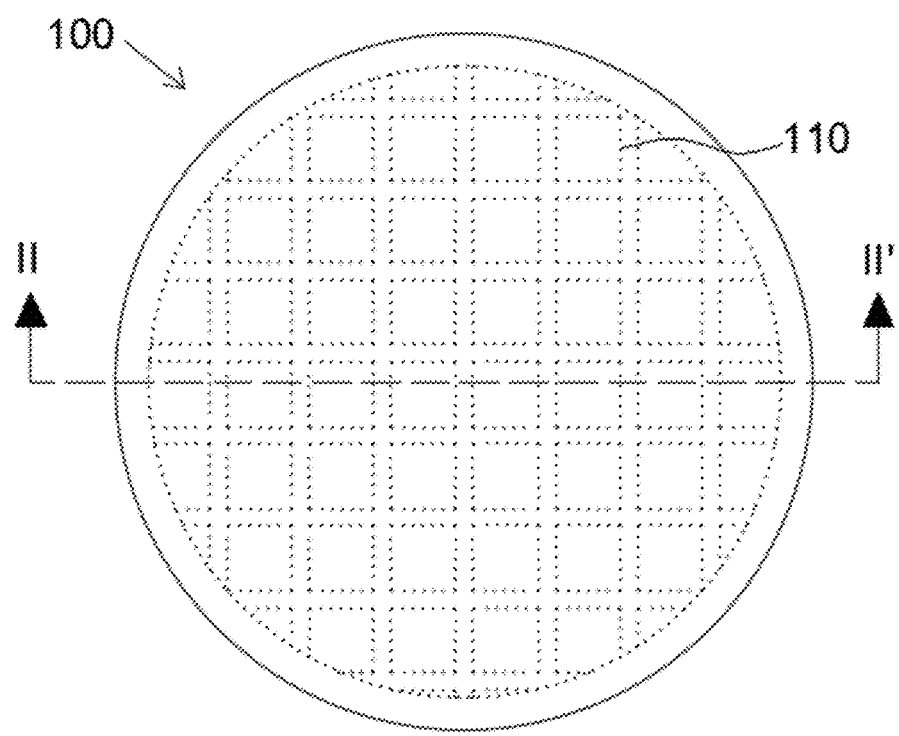
FIGS. 9c and 9d are respectively a top view and a cross-sectional side view of the solid structure of the invention having a plurality of processing target areas located in partial areas.
Figure 9D:
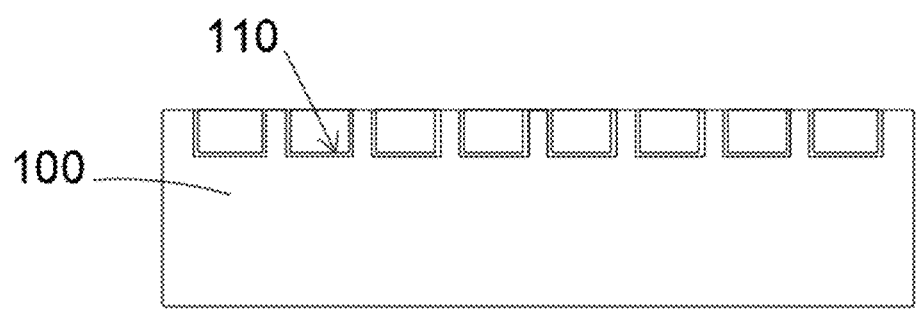

The laser source 20 used in the invention is, for example, Nd:YAG pulsed laser, Nd:YVO4 pulsed laser or Ti-Sapphire pulsed laser. The pulsed light 23 generated by the laser source 20 scans and irradiates the processing target area 110 of the solid structure 100, so that a defect density is in a range of about 100 ea/mm$^2$ to about 1,000,000 ea/mm$^2$, wherein a moving speed of the pulsed light 23 is in a range of about 10 mm/sec to about 1,000 mm/sec, a wavelength of the pulsed light 23 is greater than about 700 nm, a wavelength of the pulsed light 23 is preferably in a range of about 700 nm to about 1,600 nm, a pulse width is less than about 1,000 ns, a repetition frequency is in a range of about 5 KHz to about 10 MHz, a pulse energy (E) is, for example, in a range of about 0.1 μJ to about 1,000 μJ, and a spot diameter is, for example, in a range of about 1 μm to about 50 The invention can use a movable carrier to move the solid structure 100 horizontally (as shown by the horizontal double arrow C1 in FIG. 2 or FIG. 3) or the horizontally movable pulsed light 23 output by the laser source 20 (as shown by the horizontal double arrow L1 in FIG. 2 or FIG. 4), so that the processing target area 110 of the solid structure 100 is horizontally scanned and irradiated by the pulsed light 23. In addition, the invention can also, for example, utilize a movable carrier to move the solid structure 100 vertically (i.e., the laser source 20 is fixed longitudinally and the carrier is movable longitudinally, as indicated by the vertical double arrow C2 on a right side of FIG. 2 or FIG. 3) or the vertically movable pulsed light 23 output by the laser source 20 (that is, the laser source 20 is movable longitudinally, and the carrier is fixed longitudinally, as shown by the vertical double arrow L2 in FIG. 2 or FIG. 4), so that the processing target area 110 of the solid structure 100 is vertically scanned and irradiated by the pulsed light 23. In other words, the invention is capable of optionally adjusting a depth at which a focal point of the pulsed light 23 generated by the laser source 20 upward and downward correspondingly to irradiate the solid structure 100 according to a form of the solid structure 100 (e.g., shape) in the processing procedure to achieve better modification effect. In addition, if a cross-section of the solid structure 100 is in a warped shape, the invention is capable of adjusting a focal point to form the modified layer 120 with a uniform thickness along a surface or in the depth X of the solid structure 100 along the warped shape. The laser source 20 of the invention, for example, uses the single pulsed light 23 to form a single focal point to irradiate the solid structure 100. Moreover, in the invention, the solid structure 100 can also be irradiated, for example, with a plurality of focal points formed by the single pulsed light 23, or the solid structure 100 can be irradiated, for example, with a plurality of focal points or a single focal point formed by a plurality of the pulsed light 23. Wherein, the above-mentioned pulsed lights 23 can have a same wavelength or different wavelengths, so as to be applicable to different semiconductor materials. For example, the laser source 20 can comprise the pulsed light 23 with more than two wavelengths, so an appropriate laser source wavelength can be selected according to the solid structure 100 of different compositions. In addition, in other embodying modes, a moving mode of the above-mentioned movable carrier is not limited to vertically moving or horizontally moving the solid structure 100, the movable carrier can also, for example, move the solid structure 100 in a rotating, inclined or other manner, that is, as long as a position where a focal point of the pulsed light 23 irradiates the solid structure 100 can be adjusted, any moving modes are applicable to the invention. In addition, by adjusting a position where a focal point of the pulsed light 23 irradiates the solid structure 100, the processing target area 110 of the solid structure 100 is not limited to be fully distributed in an entire area of the solid structure 100, for example, only distributed in a part of the radial section and/or longitudinal section. For example, the processing target area 110 (as shown in FIGS. 9a and 9b) or the processing target areas 110 (as shown in FIGS. 9c and 9d) can be located in partial areas of the solid structure 100, a cross-sectional shape of the processing target area 110 is not particularly limited, it can be determined according to actual requirements. For example, it can be U-shaped as shown in FIG. 9a to FIG. 9d, wherein FIG. 9b is a cross-sectional side view taken along the section line I-I' in FIG. 9a, 9d is a cross-sectional side view taken along the section line II-II' in FIG. 9c.

In addition, as shown in FIG. 7, the processing device of the invention further comprises, for example, a heat source 70 for performing a heating step S50, so as to heat the solid structure 100 in the modification step S10 of the processing procedure. Wherein the heat source 70 is, for example, the laser source 20, the microwave or radio-frequency source 30, a heated liquid tank 80, another laser source, another microwave or radio-frequency source and/or an infrared light source. The heated liquid tank 80 in FIG. 7 can also be used as the heat source 70, and the solid structure 100 is exemplified by a wafer. In addition, the laser source 20, the microwave or radio-frequency source 30 can also be used as the heat source 70. The heated liquid tank 80 contains a liquid therein, so that the solid structure 100 is immersed in the liquid. The heated liquid tank 80 can be, for example, a thermal oil tank and has an oil 82, preferably a thermal oil, more preferably a high-temperature resistant oil, such as fluorinated oil, and in all or part of the steps of the processing procedure, the solid structure 100 can be immersed in the oil 82 to be capable of reducing unnecessary cracks or crack expansion caused by thermal shock, and capable of increasing thermal uniformity. In addition, the heated liquid tank 80 is not limited to the oil 82 contained therein, a heatable liquid can be optionally contained in the heated liquid tank 80 as a heat source according to requirements.

In addition, the processing device of the invention further comprises, for example, a detection and control unit 90 (as shown in FIG. 6 or FIG. 7) for detecting a formation state of the modified layer 120 of the solid structure 100 in a detection and control step S40 of the processing procedure, for example, by detecting an amount of free electrons, photoconductivity attenuation changes and defect generation state can be known, thereby the laser energy provided by the laser source 20 can be fed back and controlled and/or the microwave or radio-frequency energy provided by the microwave or radio-frequency source 30 can be fed back and controlled, such as instantaneous control of magnitude, frequency or processing feeding speed of the microwave or radio-frequency energy provided by the microwave or radio-frequency source 30. Wherein, the detection and control step S40 can be performed at the same time when the modification step S10 is performed, for example.

The processing procedure of the invention can even further comprise performing one subsequent step S60 or a plurality of the subsequent steps S60, the subsequent step S60 is selected from, but not limited to, for example, a group consisting of cutting, slicing, thinning, grinding, polishing, coating, vapor deposition, lithography, photolithography, etching and diffusion. Wherein the subsequent step S60 can be performed, for example, after the modification step S10, or the subsequent step S60 can be performed after the modification step S10 followed by the heating step S50.

In summary, based on the above, the processing device and the processing method for the solid structure according to the invention can have one or more than one of following advantages:

(1) The invention utilizes a variety of electromagnetic radiation sources in the modification step to cause qualitative changes or defects in the processing target area of the solid structure, thereby generating stress differences with other areas.

(2) In the modification step of the invention, the pulsed light of the laser source is used to form a hot spot in the processing target area of the solid structure, so as to cause the processing target area of the solid structure to generate a modification phenomenon, such as qualitative changes or defects, for example, weakened atomic bond, weakened structure, or monocrystalline state transformed into polycrystalline state or amorphous state. In the invention, the microwave or radio-frequency source is used to provide the microwave or radio-frequency energy to the solid structure at the same time when the modification step is performed, free electrons are generated in the processing target area of the solid structure due to supply of the laser energy, compared with other areas (non-processing target areas), generation of the free electrons is capable of absorbing more microwave energy to increase a temperature of the processing target area, and increase in temperature is conducive to the processing target area absorbing more of the laser energy to generate more free electrons, thereby absorbing more of the electromagnetic energy provided by the electromagnetic radiation source to form a forward cycle.

(3) In the invention, the heat source is used to heat the solid structure in the modification step, so that a temperature of the solid structure can be increased, and an absorption rate of the energy of the radiation source can be increased by increasing a temperature.

(4) The invention detects a formation state of the modified layer of the solid structure in the detection and control step, thereby the laser energy provided by the laser source can be fed back and controlled and/or the microwave or radio-frequency energy provided by the microwave or radio-frequency source can be fed back and controlled, such as control of magnitude, frequency or processing feeding speed of the microwave or radio-frequency energy provided by the microwave or radio-frequency source.

Note that the specification relating to the above embodiments should be construed as exemplary rather than as limitative of the present invention, with many variations and modifications being readily attainable by a person of average skill in the art without departing from the spirit or scope thereof as defined by the appended claims and their legal equivalents.

What is claimed is:

1. A processing device for a solid structure for performing a processing procedure, at least comprising:
    a laser source for providing a laser energy to a processing target area of the solid structure in a modification step of the processing procedure; and
    a microwave or radio-frequency source for providing a microwave or radio-frequency energy to the solid structure in the modification step of the processing procedure, wherein the processing target area of the solid structure weaken atomic bond structures or change a crystallinity of the processing target area by the laser energy and the microwave or radio-frequency energy, which achieve a forward cycle effect on the processing target area, to become a modified layer.

2. The processing device for the solid structure as claimed in claim 1, further comprising a heat source for heating the solid structure in the modification step of the processing procedure.

3. The processing device for the solid structure as claimed in claim 2, wherein the heat source is the laser source, the microwave or radio-frequency source, a heated liquid tank, another laser source, another microwave or radio-frequency source or an infrared light source.

4. The processing device for the solid structure as claimed in claim 1, wherein the solid structure is immersed in a liquid.

5. The processing device for the solid structure as claimed in claim 1, further comprising a detection and control unit for detecting a formation state of the modified layer of the solid structure in a detection and control step of the processing procedure, thereby the laser energy provided by the laser source being fed back and controlled, the microwave or radio-frequency energy provided by the microwave or radio-frequency source being fed back and controlled or the laser energy provided by the laser source and the microwave or radio-frequency energy provided by the microwave or radio-frequency source being fed back and controlled.

6. The processing device for the solid structure as claimed in claim 1, wherein the laser energy provided by the laser source is correspondingly adjusted according to the microwave or radio-frequency energy provided by the microwave or radio-frequency source.

7. The processing device for the solid structure as claimed in claim 1, wherein the microwave or radio-frequency energy provided by the microwave or radio-frequency source is correspondingly adjusted according to the laser energy provided by the laser source.

8. The processing device for the solid structure as claimed in claim 1, wherein the laser source provides the laser energy by generating a pulsed light, and the microwave or radio-frequency source provides the microwave or radio-frequency energy by continuously or intermittently generating an electromagnetic wave.

9. The processing device for the solid structure as claimed in claim 1, wherein the laser source and the microwave or radio-frequency source are capable of respectively providing the laser energy and the microwave or radio-frequency energy in sequence or simultaneously to make the processing target area of the solid structure become the modified layer.

10. The processing device for the solid structure as claimed in claim 1, wherein the laser source is capable of adjusting a depth at which a focal point of a pulsed light generated by the laser source correspondingly to irradiate the solid structure according to a form of the solid structure.

11. The processing device for the solid structure as claimed in claim 1, wherein the laser source uses a single pulsed light or a plurality of pulsed lights to form a plurality of focal points to irradiate the processing target area of the solid structure.

12. The processing device for the solid structure as claimed in claim 1, wherein the laser source irradiates the processing target area of the solid structure with a plurality of pulsed lights of different wavelengths.

13. The processing device for the solid structure as claimed in claim 1, wherein a direction in which the microwave or radio-frequency source provides the microwave or radio-frequency energy to the solid structure is the same as a direction in which the laser source provides the laser energy to the solid structure.

14. The processing device for the solid structure as claimed in claim 1, wherein a direction in which the microwave or radio-frequency source provides the microwave or radio-frequency energy to the solid structure is different from a direction in which the laser source provides the laser energy to the solid structure.

15. A processing method for a solid structure for performing a processing procedure, the processing procedure comprising a following step of:
    performing a modification step, wherein the modification step comprises: using a laser source to provide a laser energy to a processing target area of the solid structure; and
    using a microwave or radio-frequency source to provide a microwave or radio-frequency energy to the solid structure, wherein the processing target area of the solid structure weaken atomic bond structures or change a crystallinity of the processing target area by the laser energy and the microwave or radio-frequency energy, which achieve a forward cycle effect on the processing target area, to become a modified layer.

16. The processing method for the solid structure as claimed in claim 15, wherein in or after the modification step, further comprising performing a heating step to heat the solid structure with a heat source.

17. The processing method for the solid structure as claimed in claim 15, wherein a hardness or a stress of the modified layer of the solid structure is different from that of other areas of the solid structure.

18. The processing method for the solid structure as claimed in claim 15, wherein after the modification step is performed, further comprising performing a subsequent step on the solid structure, the subsequent step is selected from a group consisting of cutting, slicing, thinning, grinding, polishing, coating, vapor deposition, lithography, photolithography, etching and diffusion.

19. The processing method for the solid structure as claimed in claim 15, wherein the processing target area is located in a depth or on a surface of the solid structure.

20. The processing method for the solid structure as claimed in claim 19, wherein the processing target area is located in partial areas of the solid structure.

21. The processing method for the solid structure as claimed in claim 15, wherein the laser energy provided by the laser source for modifying the processing target area is correspondingly adjusted according to the microwave or radio-frequency energy provided by the microwave or radio-frequency source, or the microwave or radio-frequency energy provided by the microwave or radio-frequency source for heating the processing target area is correspondingly adjusted according to the laser energy provided by the laser source.

* * * * *